United States Patent
Skipper

(10) Patent No.: US 9,599,652 B2
(45) Date of Patent: Mar. 21, 2017

(54) SYSTEM AND METHOD FOR DETECTION OF WIRE BREAKAGE

(71) Applicant: PR Electronics A/S, Rønde (DK)

(72) Inventor: Bjarne Funch Skipper, Odder (DK)

(73) Assignee: PR Electronics A/S, Rønde (DK)

( * ) Notice: Subject to any disclaimer, the term of this patent is extended or adjusted under 35 U.S.C. 154(b) by 0 days.

(21) Appl. No.: 14/652,221

(22) PCT Filed: May 21, 2014

(86) PCT No.: PCT/DK2014/050141
§ 371 (c)(1),
(2) Date: Jun. 15, 2015

(87) PCT Pub. No.: WO2014/206413
PCT Pub. Date: Dec. 31, 2014

(65) Prior Publication Data
US 2016/0169953 A1    Jun. 16, 2016

(30) Foreign Application Priority Data

Jun. 28, 2013 (DK) ................................ 2013 70358

(51) Int. Cl.
*G01R 31/02* (2006.01)
*G01K 15/00* (2006.01)
(Continued)

(52) U.S. Cl.
CPC .......... *G01R 31/026* (2013.01); *G01K 7/026* (2013.01); *G01K 7/20* (2013.01); *G01K 15/007* (2013.01); *G01R 31/2829* (2013.01)

(58) Field of Classification Search
CPC ......... G01K 7/026; G01K 7/20; G01R 31/026
(Continued)

(56) References Cited

U.S. PATENT DOCUMENTS 2,490,010 A * 11/1949 Wild .................... G05B 11/013
                                                                    318/563
4,166,243 A    8/1979 West et al.
(Continued)

FOREIGN PATENT DOCUMENTS

EP    0 487 730 A1    6/1992
JP    5-240715 A    9/1993
(Continued)

*Primary Examiner* — Thomas Valone
(74) *Attorney, Agent, or Firm* — David S. Safran

(57) ABSTRACT

A measuring system and a method for operating it to detect wire breakage based on the measured current or voltage in which the impedance of at least a first sensor is measured and the result transmitted to a connected system. The invention is capable of detecting wire breakage and sensor failure in temperature sensor systems simultaneous with the temperature measurement by the measuring system comprising an AC current source which generates an AC current that is transmitted through the wires, and through at least the first sensor, measuring system analyzing changes in the phase angle between the current and voltage of the AC signal. If the difference in the frequency of the signal affecting the impedance or voltage of the sensor, and the frequency of the injected wire testing signal is sufficiently high, it is possible to distinguish between the first measuring signals and the second wire testing signal.

8 Claims, 5 Drawing Sheets

(51) Int. Cl.
  *G01K 7/02*     (2006.01)
  *G01K 7/20*     (2006.01)
  *G01R 31/28*    (2006.01)

(58) Field of Classification Search
  USPC ........................................................ 324/543
  See application file for complete search history.

(56) References Cited

U.S. PATENT DOCUMENTS

| | | |
|---|---|---|
| 5,317,520 A | 5/1994 | Castle |
| 7,712,958 B2 | 5/2010 | Burmeister et al. |
| 2008/0238717 A1* | 10/2008 | Short .................... H03M 1/002 340/870.21 |
| 2010/0237060 A1 | 9/2010 | Novikov |
| 2013/0070933 A1 | 3/2013 | Itou |

FOREIGN PATENT DOCUMENTS

| | | |
|---|---|---|
| JP | 6-74832 A | 3/1994 |
| JP | 8-147857 A | 9/1996 |
| JP | 2005-83989 A | 3/2005 |
| WO | 2013/062672 A1 | 5/2013 |

\* cited by examiner

SYSTEM AND METHOD FOR DETECTION OF WIRE BREAKAGE

BACKGROUND OF THE INVENTION

Field of the Invention

The present invention relates to measuring system and a method for operating a measuring system for detection of wire breakage in measuring systems comprising at least one first sensor, which sensor is connected to a measuring system by at least two wires, which measuring system comprises a current source, which current source is generating a current in the wires and through at least one first sensor which current is detected in the measuring system, which measuring system based on the measured current or voltage measures the impedance of at least the first sensor which measuring system transmit the result of the measurement of the impedance to a connected system.

Description of Related Art

In basic temperature measurements based on either RTD or TC, some of the wires used for determining the resistance of the RTD or the voltage across the TC, will be current less and can therefore in case of a wire breakage contribute to an erroneous measurement.

Wire breakage detection is well known within the temperature transmitter industry and several patents describe different technologies:

Japanese Patent JP55060828 "Detector for thermocouple failure" describes a technology, where both a differential current and a common mode current are fed into the TC sensor to analyze for insulation deterioration and wire breakage. During the test, the measurement of the TC voltage, and thereby the temperature, is invalid.

Japanese Patent JP59065267 "Apparatus for detecting wire breakage of temperature detecting element" describes a technology, where two RTD's are used to evaluate the existence of wire breakage within one of the two RTD sensors. And the technology does not support compensation for wire resistance.

Japanese Patent JP2011242349 "Resistance temperature detector circuit" describes a technology for 3-wire RTD measurements, which includes a wire breakage detection based on a change in the current fed to the RTD. As the current changes all voltages levels will change accordingly and thereby an indication of a wire breakage can be detected, if two consecutive measurements at different RTD sensor currents shows different RTD values.

Temperature transmitters are generally implemented with a wire breakage detection system based on periodically injection of a test current through the non-conducting wires followed by a test of the resulting voltage. A wire breakage will cause the voltage to increase. During the injection of the test current and a relaxing period afterwards the temperature measurement is disabled as the measurement will be influenced by the injection current and thereby not valid. This wire breakage detection method causes the temperature measurements to be relatively slow (rise time in the range of 0.5 to 1 s).

SUMMARY OF THE INVENTION

It is the object of the invention to be capable of detecting wire breakage and sensor failure in temperature sensor systems using 2-wire, 3-wire or 4-wire RTD and TC temperature measurement simultaneous with the temperature measurement. Furthermore the invention can in general be used to make surveillance of wires in connection with high-resistance voltage measurements.

Another object of the invention is to partly use the temperature measurement signal path for the wire breakage detection without violating or influencing the temperature measurement. A further object of the pending patent application is to determine wire breakage independently of wire length.

The object can be fulfilled by a system of the initially mentioned type that is modified so that the measuring system comprises an AC current source which generates an AC current that is transmitted through the wires, and through at least the first sensor, which AC signal is analyzed for changes in the phase angle between the current and the voltage of the AC signal, and by analyzing the phase angle, detects wire breakage of at least one of the wires.

It is hereby possible that if sufficient difference in frequency of the signal measuring the impedance at the sensor, and the frequency of the wire-testing basic signal is sufficiently high so that it is possible in the system that receives the signals to distinguish between the first measuring signals and the next second wire testing signal. In the situations where the sensors are operating as low-frequency sensors, then high frequency wire detection is possible. Here, it is possible to measure the phase difference between the activating AC current and the measurement of the AC voltage. Depending on the type of the sensor, the phase angle between current and voltage will have a relatively constant value as long as the wires are conducting. In the situation where a wire is broken, there will be a change in the phase difference between the AC source generating a current and the measured AC voltage. Therefore, it is possible immediately to indicate a wire breakage. By sufficient difference in frequency it is possible by a simple filtration to filter out the AC signal before an analysis of the low frequency signals is performed. Different measuring methods are possible, such as analog filters where a certain reduction of the injected AC current signal is performed, but also more complicated digital filtrations are possible where all signals resulting from the injection of the AC current are removed. It will be possible to perform a continuous analysis of the wires by continuously operating the AC current source.

In some applications, it is possible that the detection of the wire breakage is performed at time intervals. Any rapid change in the impedance of the wires and maybe also in sensors can be detected because they will lead to a change in the phase angle between the current and the measured voltage. If the system has knowledge about the maximum frequency of the signal that is expected from the sensors, it is possible, simply by detecting rapid change in impedance by indicating change in the phase angle to indicate that there is a breaking wire or maybe a defect sensor.

The frequency of the AC signal can be generated at the AC source much higher than the frequency of the signal received from the sensor. A sufficient distance in frequency between the sensor measurement bandwidth and the AC signal that is generated must be present. If the filter in the sensor measurement path, used to remove the injected wire breakage detection signal, is implemented as a narrowband notch filter, the sufficient relative frequency distance can be very small.

The measuring system can comprise an analog input filter with which the influence of higher frequencies can be reduced.

The measuring system can comprise a voltage measuring device which voltage measuring device received an input from the AC source, which input represent the phase of the AC current generated at the AC source, which measuring device measures the phase difference between the AC current source and the AC voltage present at the input of the voltage measuring device. It is hereby possible for the voltage measuring device to measure the phase difference between the generated current and the resulting voltage. The detection can be made by analog comparison or it is possible to use digital measurement of the phase difference.

Many traditional well-known methods for phase difference detection are possible. Traditionally, it is well-known to use zero crossing and measure the time from zero crossing of the generated current and until the next zero crossing of the resulting voltage exists. In this way it is possible to measure the time very precisely by digital counting means.

The measuring system can comprise a sigma-delta analog to digital converter which sigma-delta converter can comprise an anti-aliasing filter. In order to achieve best possible results it is necessary to perform a filtration after the sigma delta converter in order to reduce any higher frequencies. In the same way, in order to achieve best possible results, the anti-aliasing filter reduces further failures that may occur by using sigma delta conversion.

The sigma delta converter can be implemented with an over sampling frequency, which over sampling frequency can be much higher than the required bandwidth in order to obtain the required resolution/accuracy of the filtered digital output, which injection AC current frequency can be located at a frequency, which is higher than the required bandwidth of the primary output signal, and lower than half the sampling frequency of the sigma-delta converter, whereby the output of the sigma-delta converter can be used for the digital phase difference detector. Hereby it can be achieved that not only the measured signal is converted into a digital form but also the resulting AC voltage will be fully digitally converted so that AC voltage afterwards can be obtained from the digital signals.

The system can comprise a micro-controller, which micro controller can be adapted to perform phase difference detection, which micro controller can be adapted to fed the output from sigma-delta ADC to a filter and decimation function for generating a low-pass filtered output with a 3 dB bandwidth equal to the current injection frequency, which micro controller can be adapted to receive a synchronous demodulation/sampling signal, which signal is trigged by the injection signal, which micro controller is adapted to perform a post-filtering to reduce the noise from power line frequencies, which micro controller can be adapted to determine the phase difference between the injection current and the voltage response. By letting the micro-controller perform the filtration, it is possible to achieve the system with very few electronic components. The analog to digital conversion can be performed mostly inside the microcontroller and also the cooperation between the phase of generated current and the resulting AC voltage can easily be effected by an algorithm continuously working as part of the software in the microcontroller.

The present application further discloses a method for operating a system by which a DC current is generated in at least a pair of wires, a continuous measurement of current flowing through the wires and through at least one sensor performed, the DC voltage generated by the DC current analyzed, the impedance of the sensor calculated, the result of the measurement of the impedance transmitted to an output terminal of the system, whereby the proposed wire breakage detection method generates an AC current in the wires, detects the AC voltage at the wires, performs an analysis of the phase angle between the AC current and the AC voltage to detect wire breakage.

By the method disclosed above, it is possible to achieve a highly efficient analysis of wires connecting the sensors and the apparatus which determine the sensor value and to perform a continuous or periodic test of wire breakage. By performing continuous analysis for wire breakage, it is possible to comply with safety standards established, for example, in IEC61508. An analysis of the actual phase difference between an AC current and the resulting voltage will be a very efficient testing of the wires connecting a sensor. Because there is a difference in the frequency between the primary measuring signal and the wire breaking analyzing signals, it is possible in the system afterwards to isolate the two signals so that the influence on the measurement of signals from the sensor is not in any way disturbed by the AC test of wire breakage.

The present invention differs from the wire breakage detection described in the above mentioned patents in the way that the signal used for breakage detection is an injection current at a frequency, which is outside the frequency band of interest for the temperature measurement. Thereby, the voltage measurement or resistance determination can be performed in parallel with the wire breakage surveillance. The wire breakage detection will thereby not limit any bandwidth or rise time of the primary signal (voltage signal).

A wire breakage detection system based on an injection of a continuous out-of-frequency-band alternating current (AC) signal at the input of a measuring device, wherein the sensor wire breakage is detected on the basis of the phase response difference of the injected signal due to:

a: With no wire breakage, caused by the sensor including the capacity of the wires and b: In the case of wire breakage, caused by the capacity of the wires from the measuring unit to the wire breakage.

A wire breakage detection system, wherein the phase detection is based on analog detection in a mixer, or in an analog phase difference detector circuit.

A wire breakage detection system, wherein the phase difference detection is based on a digital phase difference detection.

A wire breakage detection system, wherein the phase detection is based on a synchronous demodulation of the signal, which is analog to digital converted as the required primary sensor voltage signal.

DETAILED DESCRIPTION OF THE INVENTION

In the following text, the figures will be described one by one and the different parts and positions seen in the figures will be numbered with the same numbers in the different figures. Not all parts and positions indicated in a specific figure will necessarily be discussed together with that figure.

The invention is a wire breakage detection system for use in TC and RTD temperature transmitters and voltage measuring system. The wire breakage detection is performed simultaneous with the primary voltage measurement as the injected signal used for wire breakage detection is an out-of-frequency-band signal, which do not disturbs or violates the signal of interest. The wire breakage signal will be removed in the afterwards filtering of the primary signal.

Figure 1C:
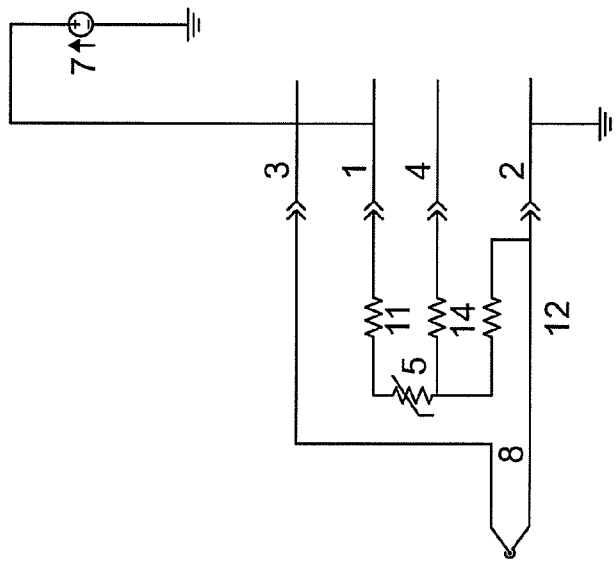
FIG. 1c shows a TC (8) measurement
Figure 1B:
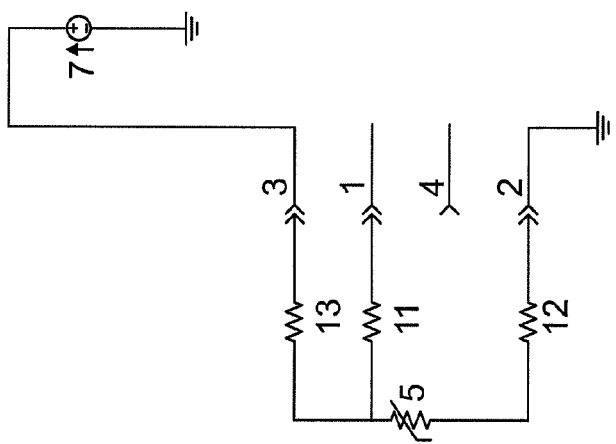
FIG. 1b shows a 3 wire RTD measurement
Figure 1A:
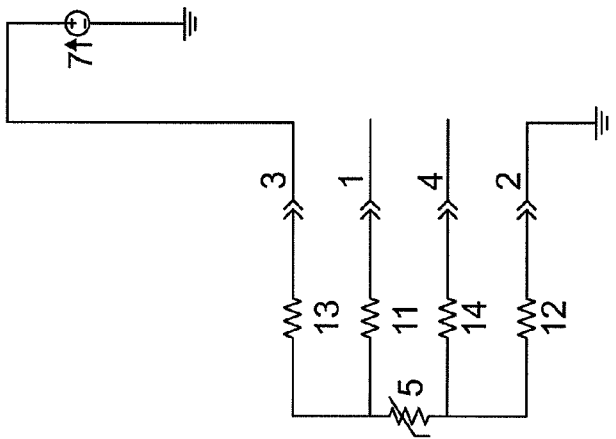
FIG. 1a shows a 4 wire RTD measurement

FIG. 1 shows a typical set up for 4-wire (FIG. 1a) and 3-wire (FIG. 1b) RTD (5) measurement. The current supply for the RTD causes a current to flow out of port 3 through the wire resistances 13, the RTD 5 and the wire resistance 12, back into port 2. The wire resistances (12 and 13) cause an erroneous measurement if only port 3 and port 2 are used for determining the RTD resistance. For 4-wire measurements port 1 and 4 can be used to determine the wire resistances 12 and 13. To avoid any influence from the wire resistances 11 and 14, the measurement at port 1 and 4 need to be current less, i.e., voltage measurement with a high impedance (much higher than the wire resistances).

The same conditions are relevant for port 1 for the 3-wire RTD measurement.

To ensure correct voltage measurements (and thereby RTD determination) at port 1 and 4 for 4-wire RTD and port1 for 3-wire RTD, the wires need to be continuously monitored. For TC measurement (8) with an external 3 wire RTD measurement for Cold Junction Compensation (CJC), which is shown on FIG. 1c the wire to ports 3 and 4 are current less as and will therefore also require continuous monitoring.

In general requires all current less (i.e., voltage-) measurements that the wires need to be monitored for wire breakage, if the installation does have a risk for wire breakage.

By injection of a small AC coupled current to the sensor wires in RTD and TC temperature measuring systems, it is, by measurement of the voltage phase response of the injected signal, possible to determine the presence/non-presence of a wire breakage without interfering with the temperature measurement.

FIG. 1a discloses a 4 wire RTD measurement, where 5 is the RTD. 1, 2, 3, and 4 are the 4 terminals of the measuring system. 7 is the current source for the resistance measurement. And 11, 12, 13, and 14 are the wire resistances of the wires connected to the terminals 1, 2, 3, and 4 respectively.

FIG. 1b shows a 3 wire RTD measurement.

FIG. 1c shows a TC (8) measurement with external cold junction compensation performed by a 3 wire RTD (5) measurement.

Figure 2A:
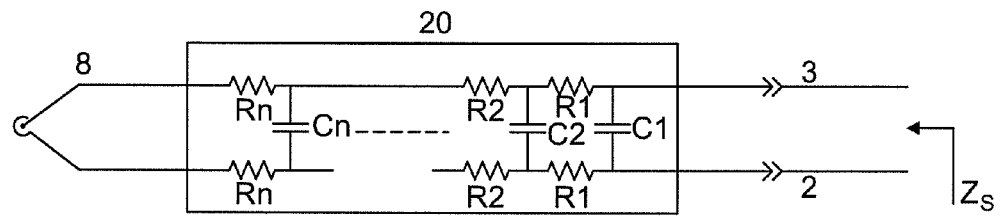
FIG. 2a shows the distributed cable capacitance
Figure 2B:
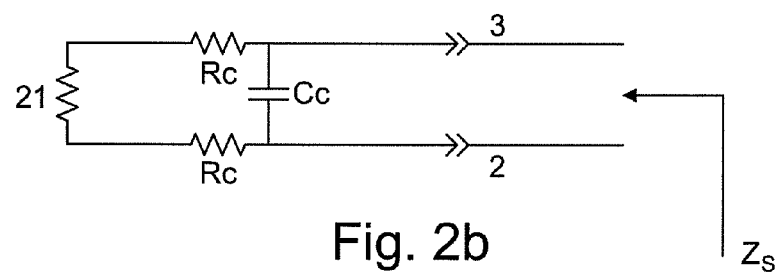
FIG. 2b shows the simplified sensor and cable model

FIG. 2a shows the distributed cable capacitance (C1, C2, . . . Cn) and the distributed cable resistance (R1, R2, . . . Rn) in a TC(8) measurement set up. The terminals at the measuring system are 2 and 3. The impedance of the sensor including the cable resistance and capacitance indicated by $Z_S$. FIG. 2a illustrate the impedance $Z_S$ seen from the measuring system. The impedance consist of the sensor (here illustrated by TC, but can as well be RTD) and the cable impedance, which consist of a distributed series resistance (R1, R2, . . . Rn) and a distributed parallel capacitance (C1, C2, . . . Cn). Besides the series resistance and parallel capacitance, the cable exhibit a series inductance and a parallel resistance, which for the low frequency purpose of temperature sensors is negligible. The cable impedance can be reduced to two wire resistances Rc and a single capacitance between the two wires Cc as illustrated on FIG. 2b. The sensor is primarily a resistance and in FIG. 2b illustrated by a pure resistance 21. The sensor resistance will typically vary from 0 ohm to 10 kohm, dependent on type and range. When no wire breakage is present, the impedance seen from the measuring system will formed of a resistance (Sensor and cable resistance in series) in parallel with the cable capacitance.

When a wire breakage is present, the impedance seen from the measuring system (port 2 and 3) will be a capacitance, which is ranging from an open circuit, if the breakage is at one of the terminals of the measuring system, to the wire capacitance, if the breakage is at the sensor terminals. Applying an input capacitance (25) at the measuring system ensures a minimum capacitance, even if the wire breakage is at the terminal (port 2 or 3) of the measuring system. A small AC current 24 is fed to the terminal 3 and will cause a voltage at the terminal, which is determined by the total impedance of the sensor, wire resistance, wire capacitance and input capacitance. The AC current 24 is located at a frequency, which is outside (higher than) the frequency band of interest with respect to temperature, resistance or voltage measurement. And will thereby not cause any disturbance of the measurement. In the case of a wire breakage, where the impedance is purely capacitive the phase difference between the injected current and the measured voltage (at the voltage measuring device 22) will be 90°. In the case of no wire breakage, where the impedance is a parallel of a resistance and a capacitance, the phase difference will be between 0° and 90°, dependent on the fraction between the sum of the conductance of the sensor and wire resistances, and the sum of susceptibility of the wire capacitance and the input capacitance.

FIG. 2b discloses the simplified sensor and cable model, where the total wire capacitance has been gathered in Cc and the wire resistance is gathered in the two resistors Rc and the sensor is a pure resistive device 21.

Figure 2C:
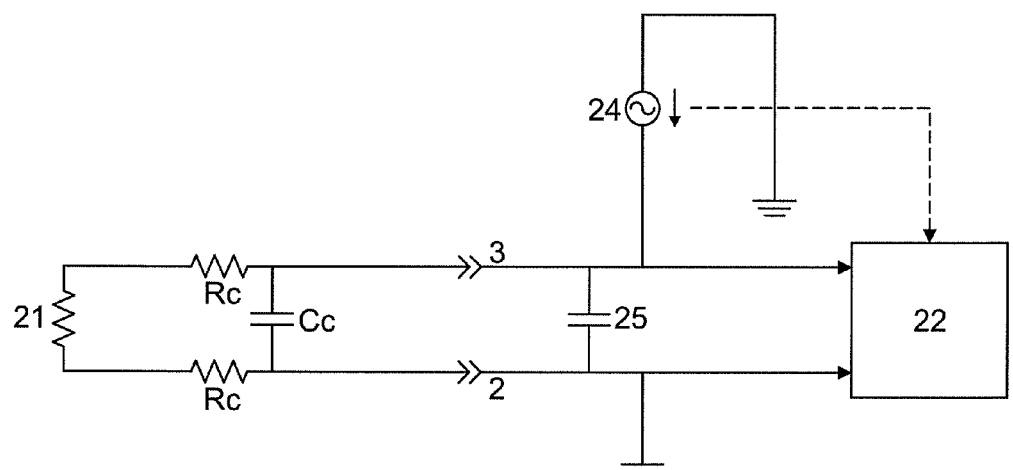
FIG. 2c shows how an AC current is fed into sensor

FIG. 2c discloses how an AC current is fed into sensor and wires to investigate the condition of the wires. The wire condition is monitored by the voltage measuring device 22, which measures the phase difference between the AC current source 24 and the voltage present at the input of the voltage measuring device 22.

Figure 3:
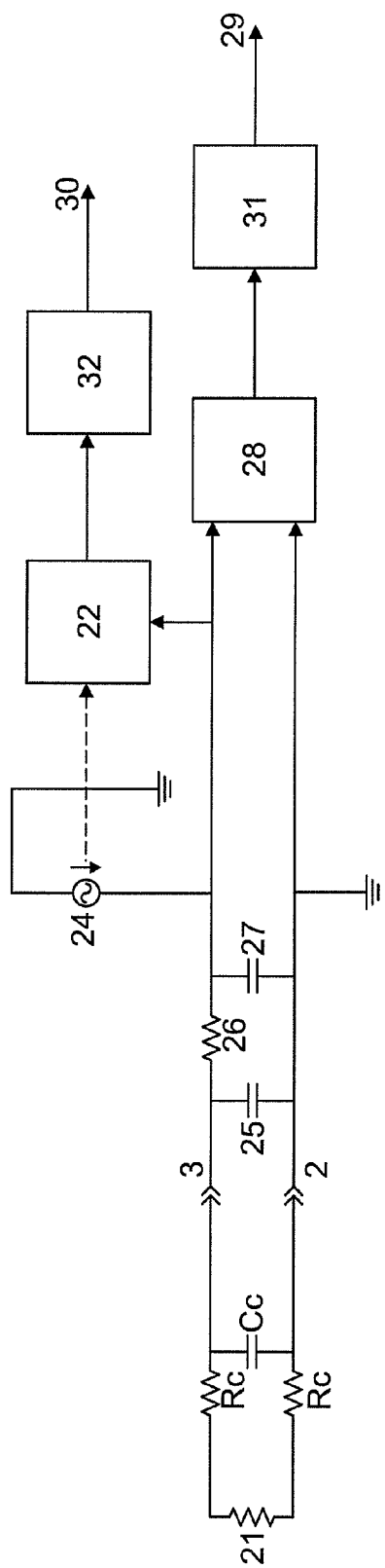
FIG. 3a shows an analog input filter

FIG. 3 discloses an input circuitry, which includes an analog input filter (25, 26, and 27), which besides the function as anti-aliasing filter for the succeeding sigma-delta analog to digital converter (28), also ensures a wire breakage detection signal for the phase detector (22) in the case, where the wire resistances Rc and the sensor resistance (TC sensor) is 0 ohm. The primary signal will be accessible at 29 after passing through the sigma-delta analog to digital converter 28 and an appropriate digital filter 31, designed to have a notch at the frequency of the injected current. The wire breakage detection signal is calculated in 32 on the basis on the output from the phase difference detector 22 and will be present at the output 30. By prober design of the input filter (25, 26 and 27) the voltage amplitude response, at the input of the sigma-delta converter and the phase difference detector, from the injection current will be less dependent on the sensor/wire resistance and the cable capacitance. The injection signal will thereby only reduce the dynamic range marginally of the sigma-delta converter (28).

Figure 4:
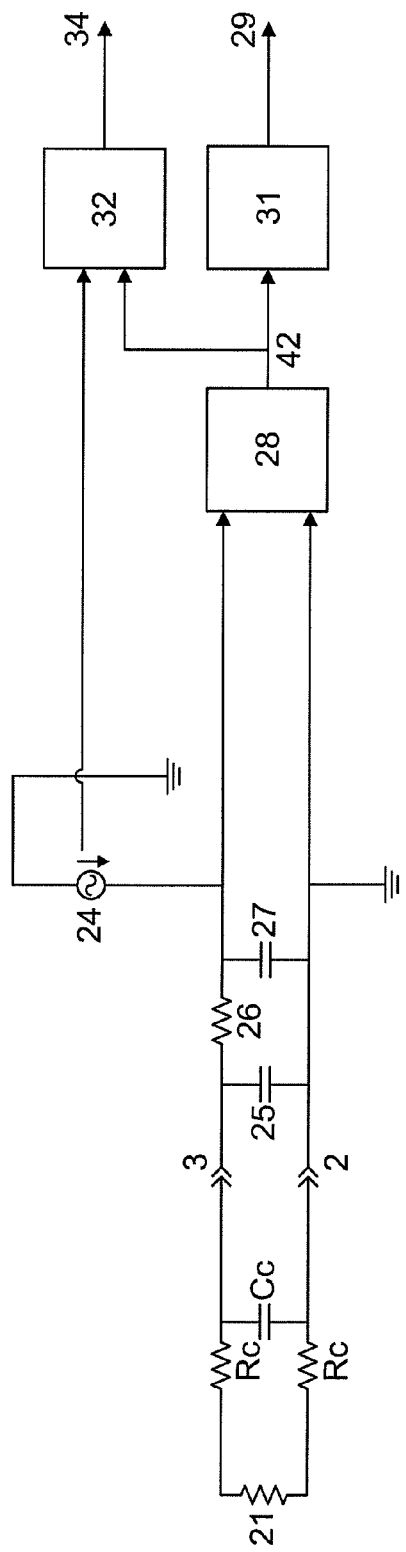
FIG. 4 shows a sigma delta converter

FIG. 4 discloses the sigma delta converter (28) which is implemented with an over sampling frequency, which is much higher than the required bandwidth in order to obtain the required resolution/accuracy of the filtered digital output at 29. If the injection current frequency is located at a frequency, which is higher than the required bandwidth of the primary signal (29), but lower than half the sampling frequency of the sigma-delta converter, the output (42) of the sigma-delta converter (28) can be used for the digital phase difference detector (33).

Figure 5:
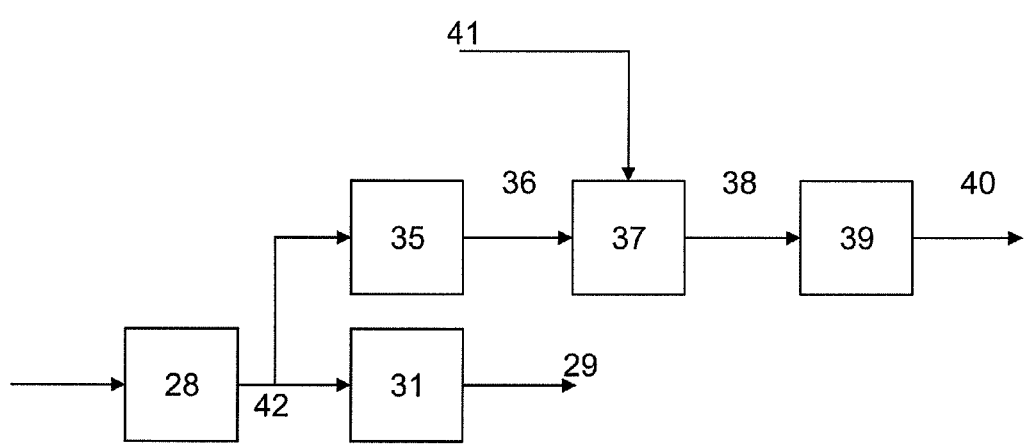
FIG. 5 shows a micro-controller optimized phase difference detector.

FIG. 5 discloses a micro-controller optimized phase difference detector, where the output (42) from sigma-delta ADC (28) is fed to a filter and decimation function (35), giving a low-pass filtered output (36) with a 3 dB bandwidth equal to the current injection frequency. 37 is a synchronous demodulation/sampling, which is trigged by the injection signal (41). A post-filtering (39) can be applied to reduce the noise from power line frequencies. From the signal (40) the phase difference between the injection current and the voltage response can be determined.

The invention claimed is:

1. System for wire breakage detection adapted for detection of wire breakage in measuring systems connected to at least one first sensor (5,8,21), which sensor (5,8,21) is connected to a measuring system by at least two wires (1,2,3,4), which measuring system comprises a current source (7), which current source (7) is generating a current in the wires (2,3) and through the at least one first sensor (5,8,21), which current is detected in the measuring system, which measuring system, based on the measured current or voltage, generates at least a first parameter of at least the first sensor (5), the measuring system being adapted to transmit the result (29) of the measurement of the parameter to a connected system, wherein the measuring system comprises an AC current source (24), which AC current source (24) is adapted to generate an AC current and to transmit the AC current through the wires (1,2,3,4) and through at least the first sensor (5,8,21), the measuring system being adapted to analyze the AC signal and analyze changes in the phase angle between current and voltage of the AC signal, and wherein the measuring system is adapted to provide an indication that at least one of the wires has broken in response to the analysis of the phase angle indicating that the phase difference between the current generated by the AC source and the measured AC voltage has changed, a phase difference between the AC current and the measured voltage of 90° providing said indication that at least one of the wires has broken and a phase difference between 0° and 90° providing an indication that no wire breakage has occurred.

2. System for wire breakage detection according to claim 1, wherein the frequency of the AC current generated at the AC current source (24) is higher than the frequency of the signal received from the sensor (5,8,21).

3. System for wire breakage detection according to claim 1, wherein the measuring system comprises an analogue input filter (25, 26, and 27).

4. System for wire detection according to claim 1, wherein the measuring system comprises a voltage measuring device (22), which voltage measuring device received an input from the voltage generating sensor (8) and the AC source (24) which input represent the phase of the AC current generated at the AC current source, which measuring device (22) measures the phase difference between the AC current source (24) and the AC voltage present at the input of the voltage measuring device (22).

5. System for wire breakage detection according to claim 1, wherein the measuring system comprises a sigma-delta analog to digital converter (28) which sigma-delta converter comprise an anti-aliasing filter.

6. System for wire breakage detection according to the claim 5, the sigma delta converter (28) is implemented with an over sampling frequency, which over sampling frequency is substantially higher than the required bandwidth of the primary output signal (29) and higher than the frequency of the injected AC current (24) which sigma delta converter output signal (42) is low-pass filtered by a digital filter (31), which digital low-pas filter remove the residual voltage signal from the AC current injection (24) as the frequency of the injected AC current is above the required bandwidth of the primary output signal (29) and the output signal (42) from the sigma delta converter is used for the digital phase difference detector (33) to create a phase difference signal (34) which can be used to determine wire breakage.

7. System for wire breakage detection according claim 5, wherein the system comprises a micro-controller, which micro controller is adapted to perform phase difference detection, which micro controller is adapted to feed the output from sigma-delta ADC to a filter and decimation function (35) for generating a low-pass filtered output (36) with a 3 dB bandwidth equal to the current injection frequency, which micro controller is adapted to receive a synchronous demodulation/sampling signal (37), which signal (37) is trigged by the injection signal (41), which micro controller is adapted to perform a post-filtering (39) to reduce the noise from power line frequencies, which micro controller is adapted to determine the phase difference between the injection current and the voltage response.

8. Method for operating a system for detection of wire breakage in measuring systems, comprising: generating a DC current in at least a pair of wires, performing a continuous measurement of current flowing through wires connected to a measuring system and at least one sensor, analyzing a DC voltage generated by the DC current, calculating an impedance of the at least one sensor, transmitting the impedance to an output terminal of the system, generating an AC current in the wires, detecting an AC voltage in the wires, performing an analysis of a phase angle between the AC current and the AC voltage to detect wire breakage, and indicating that at least one of the wires has broken when said analysis shows that the phase difference between current generated by the AC source and the measured AC voltage has changed, a phase difference between the AC current and the measured voltage of 90° providing an indication that at least one of the wires has broken and a phase difference between 0° and 90° providing an indication that no wire breakage has occurred.

* * * * *